Jan. 22, 1963 R. A. ELM ETAL 3,075,030

THERMOELECTRIC GENERATOR

Filed Dec. 22, 1959 3 Sheets-Sheet 1

INVENTORS
ROBERT A. ELM
WILLIAM G. KRAWCZAK
DELMAR D. SCHLEY
EVERT J. LEVIN

BY Carpenter Abbott Coulter & Kinney
ATTORNEYS

Jan. 22, 1963 R. A. ELM ET AL 3,075,030

THERMOELECTRIC GENERATOR

Filed Dec. 22, 1959 3 Sheets-Sheet 2

INVENTORS
ROBERT A. ELM
WILLIAM G. KRAWCZAK
DELMAR D. SCHLEY
EVERT J. LEVIN

BY Carpenter, Abbott, Coulter & Kinney
ATTORNEYS

INVENTORS
ROBERT A. ELM
WILLIAM G. KRAWCZAK
DELMAR D. SCHLEY
EVERT J. LEVIN
BY Carpenter Abbott Coulter & Kinney
ATTORNEYS United States Patent Office 3,075,030
Patented Jan. 22, 1963

3,075,030
THERMOELECTRIC GENERATOR
Robert A. Elm, St. Paul, and William G. Krawczak, Delmar D. Schley, and Evert J. Levin, White Bear Lake, Minn., assignors to Minnesota Mining and Manufacturing Company, St. Paul, Minn., a corporation of Delaware
Filed Dec. 22, 1959, Ser. No. 861,328
13 Claims. (Cl. 136—4)

This invention relates to improvements in thermoelectric generators and relates more particularly to thermopiles of improved efficiency.

The development in recent years of improved thermoelectric materials in the form of semiconductors having high thermoelectric power, low electrical resistivity, and low thermal conductivity has created renewed interest in the development of thermoelectric generators producing usable amounts of power and having efficiency characteristics heretofore unobtainable. These new materials pose certain problems, however, since they are extremely fragile and tend to oxidize as well as to sublimate at higher temperatures.

It is the general object of the present invention to provide an improved thermoelectric generator in which the use of improved thermoelectric materials is complemented by the embodiment of said materials into a generator structure characterized by high thermal efficiency and compactness.

Another object of the invention is to provide an improved thermoelectric generator having embodied therein adjustable connections affording a thermoelectric circuit of consistently low electrical resistance as well as affording efficient heat transfer from the heat source to the hot thermojunctions and from the cold thermojunctions to the heat dissipating means, the adjustable character of said connections making it unnecesary to maintain extremely fine tolerances such as would otherwise be required for optimum thermal transfer.

Another object of the invention is to provide an improved thermoelectric generator of the aforementioned character which is well adapted for use with a variety of heat sources.

Still another object of the invention is to provide an improved generator of the class described affording stable and consistent operation by virtue of incorporation therein of means for eliminating or reducing to tolerable limits both sublimation and oxidation of the thermoelements.

Another object of the invention is to provide an improved thermoelectric generator affording maximum utilization of the heat input by virtue of the incorporation therein of novel means tending to prevent escape of heat from the heat source except through the thermoelements.

Another object of the invention is to provide an improved thermoelectric generator in which the heat source is capable of being supported substantially and entirely by the thermoelements which are placed under longitudinal compression to afford a low resistance pressure contact at the hot thermojunctions and to afford the thermoelements substantial shock resistance, said longitudinal compression being applied to the thermoelements by novel heat transfer and force applying means of a character to minimize any bending moments in said thermoelements.

Another object of the invention is to provide an improved thermoelectric generator which is disposed within an hermetically sealed heat conductive enclosure, said enclosure being operative to function as heat dissipating means and being isolated from any mechanical stresses incident to placement of the thermoelements under longitudinal compression.

Other and further objects and advantages of the invention will become apparent as the description proceeds, reference being had to the drawings accompanying and forming a part of this specification in which.

Figure 1:
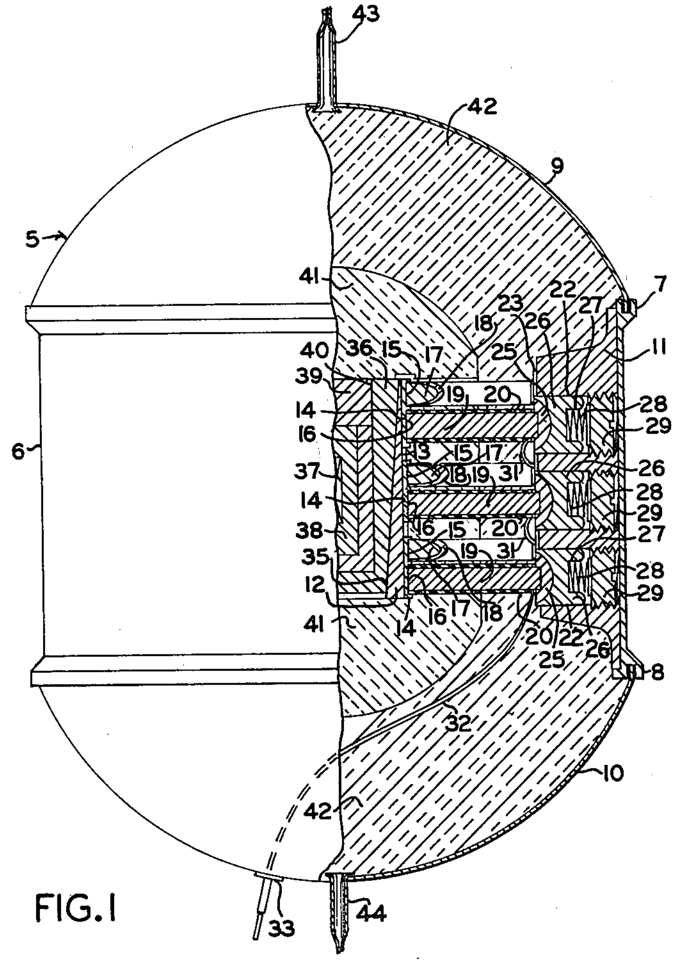
FIGURE 1 is a view partly in elevation and partly in vertical section illustrating one form of thermoelectric generator constructed in accordance with the inventive concept, the vertical section being taken approximately along the line I—I of FIGURE 2.
Figure 2:
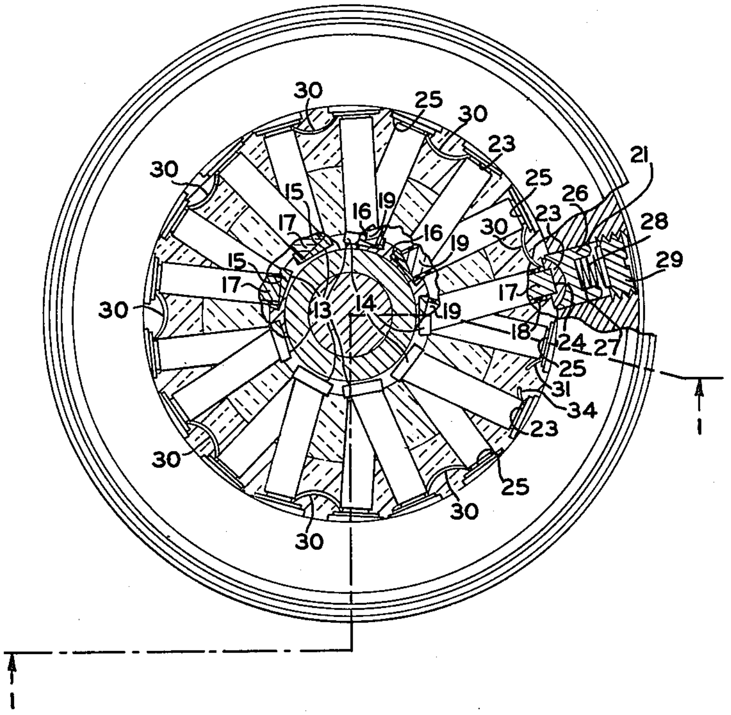
FIGURE 2 is a plan view of the improved generator of FIGURE 1 with the cover and a portion of the thermal insulation removed, parts being broken away and shown in section.

Referring more particularly to FIGURE 1 of the drawings, the form of the invention illustrated therein comprises an hermetically sealed metallic enclosure 5 of good thermal conductivity including a cylindrical intermediate section 6 having thickened end portions 7 and 8 grooved to sealingly receive generally hemispherical end caps 9 and 10 which are sealingly fixed within the accommodating grooves by soldering. A cylindrical heat dissipating and supporting member 11 of metal of good thermal conductivity has a snug coaxial heat conductive fit within the enclosure section 6 as shown. Disposed coaxially of and in spaced relation with the annular member 11 is hot thermojunction means comprising a metallic sleeve 12 of good thermal conductivity having a plurality of axially extending rectangular peripheral grooves 13. Nine such grooves 13 are shown in FIGURE 2. The hot thermojunction means also includes a plurality of rectangular hot junction electrodes or shoes 14 each having a snug heat conductive fit within the accommodating groove 13.

It will be observed that in the form of the invention illustrated in FIGURE 1 there are three hot junction electrodes 14 in each groove 13. In order to electrically insulate the electrodes 14 from the sleeve 12 while providing a connection of good thermal conductivity therebetween, the surfaces of the electrodes 14 engaging the surfaces of the grooves 13 are provided with a thin layer of insulating material which may take the form of an aluminum oxide coating applied thereto, for example, by flame spraying. Alternatively, a thin layer of mica may be provided as an interface between the mating surfaces of the electrodes 14 and grooves 13. The hot junction electrodes 14 are preferably made of iron, and the outer surface of each of said electrodes is formed with a pair of spaced axially aligned flat-bottomed cylindrical recesses 15 and 16. The axes of the recesses 15 and 16 are in parallel planes and for a given electrode 14 are preferably disposed at an angle to one another symmetrically about a radial plane extending along the axial center line of the electrode.

A plurality of generally radially extending cylindrical thermoelements 17 of one conductivity type, for example N-type, have their inner ends disposed coaxially within the respective recesses 15 of the electrodes 14, said thermoelements being preferably surrounded by a snug fitting sleeve 18 of mica or other suitable material, and said tube having a snug fit within the respective recess 15. A plurality of generally radially extending cylindrical thermoelements 19 of opposite conductivity type, for example P-type, have their inner ends coaxially disposed within the respective recesses 16 and are preferably snugly surrounded by coaxial sleeves 20 of mica or other suitable material which, in turn, has a snug fit within the respective recess 16.

The thermoelements 17 and 19 may be of any suitable thermoelectric material having a high thermoelectric power, low electrical resistivity and low thermal conductivity. Preferred materials include those disclosed in Robert W. Fritts and Sebastian Karrer United States Letters Patent No. 2,811,571. For maximum thermal conversion efficiency it is preferred to have the thermoelements 17 and 19 formed of segments or portions of thermoelectric material affording an optimum figure of merit for the particular portion of the temperature gradient in which the segment or portion operates. Thermoelements of this type are disclosed in the copending application for United States Letters Patent of Russell E. Fredrick and Robert W. Fritts, Serial No. 775,529, filed November 21, 1958, now U.S. Patent No. 3,051,767, assigned to the assignee of this application.

As shown in FIGURES 1 and 2, the annular heat dissipating and supporting member 11 is formed with a separate radial bore 21 coaxially aligned with each of the thermoelements 17, and said member is further formed with a separate radial bore 22 coaxially aligned with each of the thermoelements 19. Electrical contact with the thermoelements 17 is made by cold junction electrodes 23, formed, for example, of copper. Each of the electrodes 23 is formed with a cylindrical recess 24 into which the outer end of the associated thermoelement 17 is fixed, as by soldering. Electrical contact with the thermoelements 19 is made by cold junction electrodes 25 which are similar to the electrodes 23 and are similarly fixed to the outer ends of the thermoelements 19. The cold junction electrodes 23 and 25 are disposed within the inner ends of the bores 21 and 22 respectively as shown.

Means is provided for placement of the thermoelements 17 and 19 under longitudinal compression, said means being effective to bias said thermoelements into low electrical resistance pressure contact with the associated hot junction electrodes or shoes 14 as well as to afford said thermoelements substantial shock resistance. To this end, the cold junction electrodes 23 and 25 are each provided with an outer surface of generally spherical configuration. A cylindrical force applying member 26 is disposed within each of the radial bores 21 and 22 and has a generally spherical inner end surface complemental to the outer surface of the associated cold junction electrode 23 or 25 as shown. The outer end surface of each of the force applying members 26 is recessed as at 27 to receive a helical compression spring 28, the outer end of which bears against an adjustment screw 29 threaded into the outer end of the accommodating bore 21 or 22. The compression springs 28, acting through the force applying members 26 exert a radially inwardly directed force on the cold junction electrodes 23 and 25 to thereby exert a similar force on the thermoelements 17 and 19, biasing the inner ends of said thermoelements into low resistance electrical contact with the hot junction electrodes 14 within the recesses 15 and 16. This force also biases the hot junction electrodes 14 into engagement with the base of the accommodating grooves 13 of the sleeve 12 to afford good thermal transfer from said sleeve to said thermoelements.

The connection between the cold junction electrodes 23 and 25 and the associated force applying members 26 is a generally ball and socket type of connection which is particularly advantageous. Mechanically, it insures that the longitudinal compressive stress is applied to the thermoelements in a manner to minimize any bending moments in said thermoelements. Also, said connection permits relative movement of the parts during heating up and cooling down, thereby protecting the thermoelements from bending stresses which might otherwise be impressed thereon during such times. Further, the relatively large interface between the cold junction electrodes 23 and 25 and the associated force applying members 26 insures good heat transfer from the thermoelements to said force applying member, whereas the relatively large interface between said force applying members and the heat dissipating member 11 insures good heat transfer to the member 11 from which the heat flows to the enclosure 5 for transfer to the environment. The adjustment screws 29 permit the force exerted on the thermoelements by the springs 28 to be individually adjusted, and such adjustability permits the use of less precise tolerances than would otherwise be required if equivalent thermal transfer were to be attained in the absence of such adjustability.

Each hot junction electrode or shoe 14 and the particular thermoelements 17 and 19 associated therewith forms a thermocouple, there being in the illustrated embodiment three superimposed radial arrays of nine thermocouples each. As shown in FIGURE 2, the thermocouples of each radial array are connected in series circuit by jumpers or conductors 30 which connect the cold junction electrode 23 of one thermocouple with the cold junction electrode 25 of an adjacent thermocouple in the same array. Jumpers or conductors 31 connect the superimposed radial arrays in series circuit by connection of a contact electrode 25 of one array with a contact electrode 23 of the subjacent radial array. Power output connections for the thermoelectric generator including all of the thermocouples (FIGURE 1) connected in series circuit are provided by a conductor 32 connected to a cold junction electrode 25 of the lowermost array constituting one end of the series circuit, the conductor 32 being brought out through a suitable hermetic seal 33 in the enclosure 5. Another conductor 34 (FIGURE 2) is connected to a cold junction electrode 23 of the uppermost array constituting the other end of the series circuit, the conductor 34 being similarly brought out through a suitable seal (not shown) in the enclosure 5. The conductors 32 and 34 are adapted for connection to any suitable load, preferably one having an electrical resistance matched to that of the illustrated generator.

In order to prevent electrical short circuiting of the thermocouples to the supporting and heat dissipating member 11 all of the surfaces of the force applying cylinders 26 except the concave surface engaged by the associated cold junction electrodes 23 or 25 are provided with a thin coating of aluminum oxide. Such an aluminum oxide coating affords electrical insulation while at the same time having good thermal conductivity permitting efficient heat transfer between the cylindrical surfaces of the members 26 and the surrounding bore surfaces of the member 11. Heat transfer from the cold junction electrodes 23 and 25 to the member 11 is enhanced by the use of a thin film of high vacuum grease of good thermal conductivity, for example silicone grease, at the interfaces between the cold junction electrodes and the force applying members 26, as well as at the cylindrical interfaces of the members 26 and the surrounding surfaces of the accommodating bores 21 and 22.

The sleeve 12 is formed with a tapered bore, for example a bore 35 having a 4 degree locking taper, and disposed within said bore is a capsule or cup-shaped member 36 having a frusto-conical outer surface complemental to the bore 35 and having a snug fit therein. The capsule 36 is preferably made of metal having a higher coefficient of thermal expansion than that of the material from which the sleeve 12 is made. For example the capsule 36 may be made of austenitic stainless steel and the sleeve 16 of ferritic stainless steel. This insures that as the temperature of the capsule 36 and sleeve 12 increases, the frictional engagement therebetween becomes more intimate and the resistance of thermal transfer at the interface decreases. Preferably the capsule 36 is cooled prior to insertion into the sleeve 12. The capsule 36 accommodates a heat source which may be of any suitable or desired type. In the illustrated embodiment the heat source takes the form of a quantity 37 of radioactive isotope sealed within concentric cylinders 38 and 39, the latter being disposed within a bore 40 in capsule 36 as shown.

In order to minimize the escape of heat from the heat source except through the thermoelements 17 and 19, all of the unused space within the enclosure 5 is filled with thermal insulation. In the form of the invention shown in FIGURES 1 and 2 the efficiency of the generator is enhanced by using concentric segments 41 and 42 of block type insulation each of which affords optimum thermal insulating characteristics within a different temperature range. For example, the inner segment or shell 41 may be formed of colloidal silica, and the outer segment or shell 42 may be made of fibrous silica. The colloidal silica affords optimum thermal insulation characteristics at the higher hot thermojunction temperature range to which it is exposed, and the fibrous silica affords optimum thermal insulation characteristics at the cold thermojunction temperature range to which it is exposed. It will be observed that the lower portion of the inner segment 41 abuts the lower end of the sleeve 12 and that the upper portion thereof abuts the upper end of the capsule 36 so that the capsule 36 is maintained firmly seated within the bore 35 of the sleeve 12 at all times. The effectiveness of the thermal insulation 41 and 42 is enhanced by removal of any air from the enclosure 5, for example through the tubes 43 and 44, and the substitution therein of a high molecular weight gas, for example argon, containing a trace of a reducing gas, for example methane, after which substitution the tubes 43 and 44 are sealed.

The use of the reducing gas within the enclosure 5 tends to prevent oxidation of the thermoelements 17 and 19, particularly at the pressure contact thereof with the hot junction electrodes 14 where the formation of oxide films would tend to increase the electrical resistance of the circuit. The snug fit of the mica tubes 18 and 20 around the thermoelements 17 and 19 respectively and within the recesses 15 and 16 respectively tends to prevent or restrict sublimation of the thermoelements at the hot junction end. The tubes 18 and 20 further function to support the thermoelements against deformation due to transverse acceleration or shock.

It will be observed that the enclosure 5, in addition to functioning as an hermetically sealed container for the thermoelectric generator, functions as an efficient heat radiating and convecting means. If desired, the enclosure 5 may be provided with cooling fins or other suitable additional heat dissipating means in any well known manner. The container 5 need not be constructed to withstand substantial pressures, since it is not subjected to any mechanical stresses incident to the placement of the thermoelements under longitudinal compression, any such mechanical stresses being isolated from the enclosure 5 by the supporting and heat dissipating member 11 which is sufficiently strong to withstand such forces without deformation.

Figure 3:
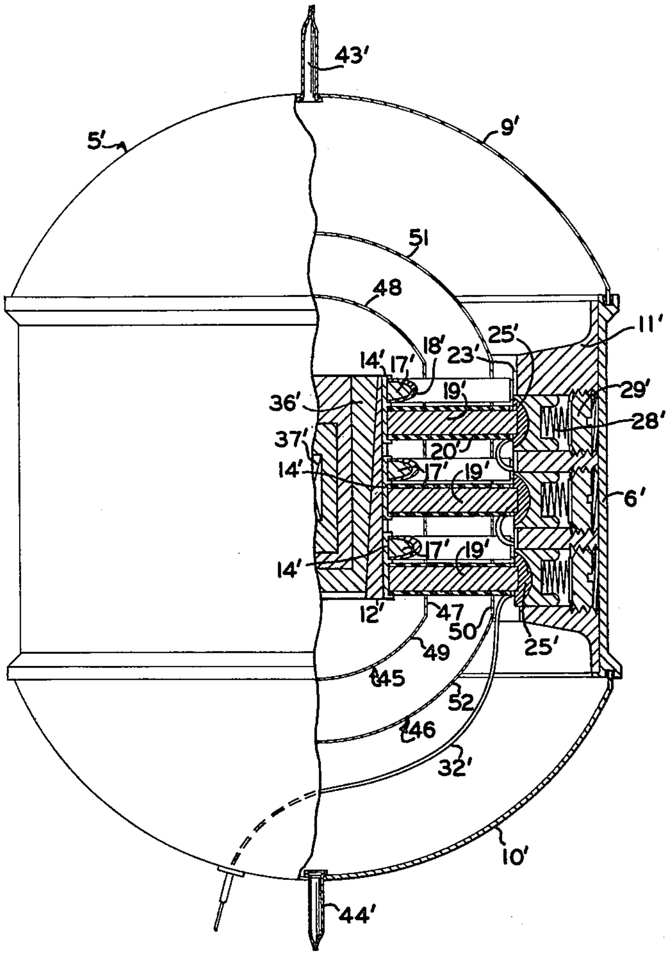
FIGURE 3 is a view similar to FIGURE 1 illustrating another form of thermoelectric generator constructed in accordance with the inventive concept.

FIGURE 3 illustrates another form of thermoelectric generator constructed in accordance with the invention and is identical in most respects to the generator shown in FIGURES 1 and 2. In FIGURE 3 the elements indicated by primed reference characters to correspond to similar elements shown in FIGURES 1 and 2 and indicated by the same reference characters unprimed. In FIGURE 3, the thermal insulation 41 and 42 of the generator shown in FIGURES 1 and 2 is replaced by reflector means. This reflector means takes the form of a pair of concentric reflectors 45 and 46 having metallic highly polished inner and outer surfaces. The reflector 45 comprises a tubular cylindrical intermediate section 47 and end caps 48 and 49, the section 47 thereof being perforated to permit the passage therethrough of the thermoelements 17′ and 19′ and their surrounding mica sleeves. As shown the intermediate section 47 is spaced from the sleeve 12′. The reflector 46 comprises a tubular cylindrical intermediate section 50 and opposite end caps 51 and 52, the intermediate section 50 thereof also being perforated to permit the passage therethrough of the thermoelements 17′ and 19′ and their surrounding mica sleeves. As shown the reflector 46 is spaced outwardly from the reflector 45 with the intermediate section 50 being spaced between the section 47 of reflector 45 and the cold junction electrodes of the thermoelements.

The highly polished inner surfaces of the reflectors 45 and 46 reflect back toward the hot thermojunction means and the heat source, heat radiated outwardly therefrom and tending to bypass the thermoelements. The highly polished outer surfaces of the reflectors 45 and 46 afford said reflectors low emissivity tending to reduce radiation of heat therefrom.

It will be observed that in FIGURE 3 all of the support for the central structure comprising the heat source and the hot thermojunction means including sleeve 12′ and hot junction electrodes 14′, as well as all of the support for the reflectors 45 and 46, is provided by the thermoelements 17′ and 19′. The insulation afforded by the reflectors 45 and 46 is enhanced by the fact that the enclosure 5′ is evacuated prior to the sealing off of the tubes 43′ and 44′, such evacuation concomitantly reducing the tendency of the thermoelements to oxidize by removal of substantially all available oxygen from the enclosure 5′.

Having thus described two specific embodiments of the invention, it is to be understood that the illustrated forms were selected to facilitate the disclosure rather than to limit the number of forms which the invention may assume. Various modifications, adaptations and alterations may be applied to the specific form shown to meet the requirements of practice, without in any manner departing from the spirit or scope of the invention, and all of such modifications, adaptations and alterations are contemplated as may come within the scope of the appended claims.

What is claimed as the invention is:

1. A thermoelectric generator comprising a thermally conductive annular heat dissipating and supporting member formed with a plurality of cylindrical radial bores, thermojunction means spaced from and centrally disposed within said annular member, a plurality of radially extending thermoelements spanning the annular space between said thermojunction means and said annular member and each in registration with one of said radial bores, a junction electrode at the outer end of each of said thermoelements, a separate cylindrical thermally conductive force applying member having a snug coaxial sliding fit within each radial bore with which a thermoelement is in registry, and biasing means cooperable with said annular member and with each of said force applying members for causing the latter to engage and exert radially inwardly directed forces on said junction electrodes to thereby place each of said thermoelements under longitudinal compression.

2. A thermoelectric generator according to claim 1 in which heat transfer between said force applying member and said heat dissipating member at said slidable connection is enhanced by a layer of heat conductive grease at the interface therebetween.

3. A thermoelectric generator according to claim 1 wherein heat transfer between said junction electrodes and said annular heat dissipating member is enhanced by a layer of heat conductive grease on the surfaces of said force applying members engaging said electrodes and said heat dissipating member.

4. A thermoelectric generator comprising a thermally conductive annular heat dissipating and supporting member formed with a plurality of cylindrical radial bores, thermojunction means spaced from and centrally disposed within said annular member, a plurality of radially extending thermoelements spanning the annular space between said thermojunction means and said annular member and each in registration with one of said radial bores, a junction electrode at the outer end of each of said thermoelements, a separate cylindrical thermally conductive force applying member having a snug coaxial sliding fit within each radial bore with which a thermoelement is in registry, a member removably fixed in the outer end of each of said radial bores, and a separate compression spring interposed between each said removable member and its associated force applying member causing the latter to engage and exert a radially inwardly directed force on the associated junction electrode and thereby to place the associated thermoelement under longitudinal compression.

5. A thermoelectric generator comprising a thermally conductive annular heat dissipating and supporting member formed with a plurality of cylindrical radial bores, thermojunction means spaced from and centrally disposed within said annular member, a plurality of radially extending thermoelements spanning the annular space between said thermojunction means and said annular member and each in registration with one of said radial bores, a junction electrode at the outer end of each of said thermoelements, a separate cylindrical thermally conductive force applying member having a snug coaxial sliding fit within each radial bore with which a thermoelement is in registry, an adjustment screw threaded into the outer end of each of said radial bores, and a separate compression spring interposed between each adjustment screw and its associated force applying member causing the latter to engage and exert a radially inwardly directed force on the associated junction electrode and thereby to place the associated thermoelement under longitudinal compression.

6. A thermoelectric generator comprising an annular support, hot thermojunction means spaced from and centrally disposed within said annular support and comprising a heat conductive sleeve having a tapered bore, a heat conductive capsule having a frusto-conical outer surface complemental to said tapered bore positioned coaxially within said bore, said capsule being made of material having a higher coefficient of thermal expansion than the material of said sleeve, a plurality of radially extending thermoelements spanning the space between said thermojunction means and said support, a junction electrode at the outer end of each of said thermoelements, and means cooperable with said support and with each of said junction electrodes for exerting radially inwardly directed forces on said junction electrodes to thereby place each of said thermoelements under longitudinal compression.

7. A generator according to claim 6 wherein the taper of the sleeve bore and the capsule outer surface is a locking taper.

8. A thermoelectric generator comprising a thermally conductive heat dissipating member formed with at least one cylindrical bore, thermojunction means spaced from said heat dissipating member, a thermoelement spanning the space between said thermojunction means and said member and in registration with said at least one bore, and thermally conductive junction electrode and force applying means engaging the end of said thermoelement adjacent said member, said means including a cylindrical thermally conductive member having a snug coaxial sliding fit within said at least one bore, and biasing means cooperable with said heat dissipating and said cylindrical members for exerting a force placing said thermoelement under compression between said thermojunction means and said junction electrode and force applying means.

9. A thermoelectric generator comprising a thermally conductive heat dissipating member formed with at least one cylindrical bore, thermojunction means spaced from said heat dissipating member, a thermoelement spanning the space between said thermojunction means and said member and in registration with said at least one bore, a junction electrode at the end of said thermoelement adjacent said member, a cylindrical thermally conductive force applying member having a snug coaxial sliding fit within said at least one bore, and biasing means cooperable with said heat dissipating and force applying members for causing said force applying member to engage and exert a force on said junction electrode placing said thermoelement under compression between said thermojunction means and said junction electrode.

10. A thermoelectric generator according to claim 8 in which heat transfer between said junction electrode and force applying means and said heat dissipating member is enhanced by a layer of heat conductive grease on the surface of said cylindrical member engaging said heat dissipating member.

11. A thermoelectric generator comprising means defining a heat conductive enclosure, a heat source within said enclosure, thermoelement means within said enclosure having inner hot thermojunction means adjacent and in heat transfer relation with said heat source and having outer cold thermojunction means adjacent and in heat transfer relation with said enclosure, and means for minimizing the flow of heat from said heat source to said enclosure except through said thermoelement means comprising thermal insulation within said enclosure surrounding said heat source and in which said thermoelement means is embedded, said insulation comprising concentric inner and outer shells each formed of material affording optimum heat insulation within a different temperature range, the material for each shell being selected to afford optimum heat insulation at the portion of the gradient in which it is disposed.

12. A thermoelectric generator comprising a thermally conductive annular support, inner hot thermojunction means spaced from and centrally disposed within said annular support, a plurality of radially extending thermoelements spanning the space between said thermojunction means and said support, a cold junction electrode at the outer end of each of said thermoelements, means cooperable with said support and with each of said junction electrodes for exerting radially inwardly directed forces on said junction electrodes to thereby place each of said thermoelements under longitudinal compression, and means tending to prevent the flow of heat between said inner hot thermojunction means and said cold junction electrodes except through said thermoelements, said means comprising thermal insulation surrounding said inner hot thermojunction means and filling the annular space between said inner hot thermojunction means and said support, said thermoelements being embedded in said insulation.

13. A thermoelectric generator according to claim 12 wherein said insulation is in the form of concentric inner and outer shells each formed of material affording optimum thermal insulation within a different temperature range, the material for each shell being selected to afford optimum heat insulation at the temperature range in which it is disposed.

References Cited in the file of this patent

UNITED STATES PATENTS

| | | |
|---|---|---|
| 1,848,655 | Petrik | Mar. 8, 1932 |
| 2,872,788 | Lindenblad | Feb. 10, 1959 |
| 2,919,553 | Fritts | Jan. 3, 1960 |
| 2,932,954 | Evans | Apr. 19, 1960 |
| 2,942,051 | Roeder | June 21, 1960 |
| 2,949,497 | Jarvis et al. | Aug. 16, 1960 |

FOREIGN PATENTS

| | | |
|---|---|---|
| 540,886 | Belgium | Sept. 15, 1955 |